United States Patent [19]

Walker

[11] Patent Number: 5,022,869
[45] Date of Patent: Jun. 11, 1991

[54] ADAPTER FOR USE WITH A BUMPERLESS CHIP CARRIER

[75] Inventor: Kevin E. Walker, Harrisburg, Pa.

[73] Assignee: AMP Incorporated, Harrisburg, Pa.

[21] Appl. No.: 431,794

[22] Filed: Nov. 6, 1989

[51] Int. Cl.⁵ ............................................. H01R 23/72
[52] U.S. Cl. ..................................... 439/526; 206/331
[58] Field of Search ................................... 439/69–73, 439/525, 526, 330, 331; 206/328, 329, 331

[56] References Cited

U.S. PATENT DOCUMENTS

| | | | |
|---|---|---|---|
| 4,052,118 | 10/1977 | Scheingold et al. | 339/17 |
| 4,637,670 | 1/1987 | Coller et al. | 439/55 |
| 4,744,009 | 5/1988 | Grabbe et al. | 361/398 |
| 4,768,973 | 9/1988 | Bakermans | 439/331 |
| 4,872,845 | 10/1989 | Korsunsky et al. | 439/526 |

OTHER PUBLICATIONS

AMP publication entitled "Micro-Pitch Socket", 5-1988.

Primary Examiner—Neil Abrams
Attorney, Agent, or Firm—Bruce J. Wolstoncroft

[57] ABSTRACT

Chip carrier sockets have terminals provided therein for receipt of chip carriers which have leads extending therefrom. The chip carrier sockets have covers which are provided with resilient retention arms, the resilient retention arms cooperate with the chip carriers to retain the chip carriers in the cover. However, with various chip carriers, no structure is provided to cooperate with the resilient retention means of the cover. Therefore, an adapter is provided to cooperate with the chip carrier, to insure that the chip carrier is accurately inserted and maintained in the cover of the chip carrier socket. The adapter has projections which extend from the corners of the frame, the projections dimensioned to be received in the retention arms of the cover to insure that the adapter is maintained in position.

5 Claims, 3 Drawing Sheets

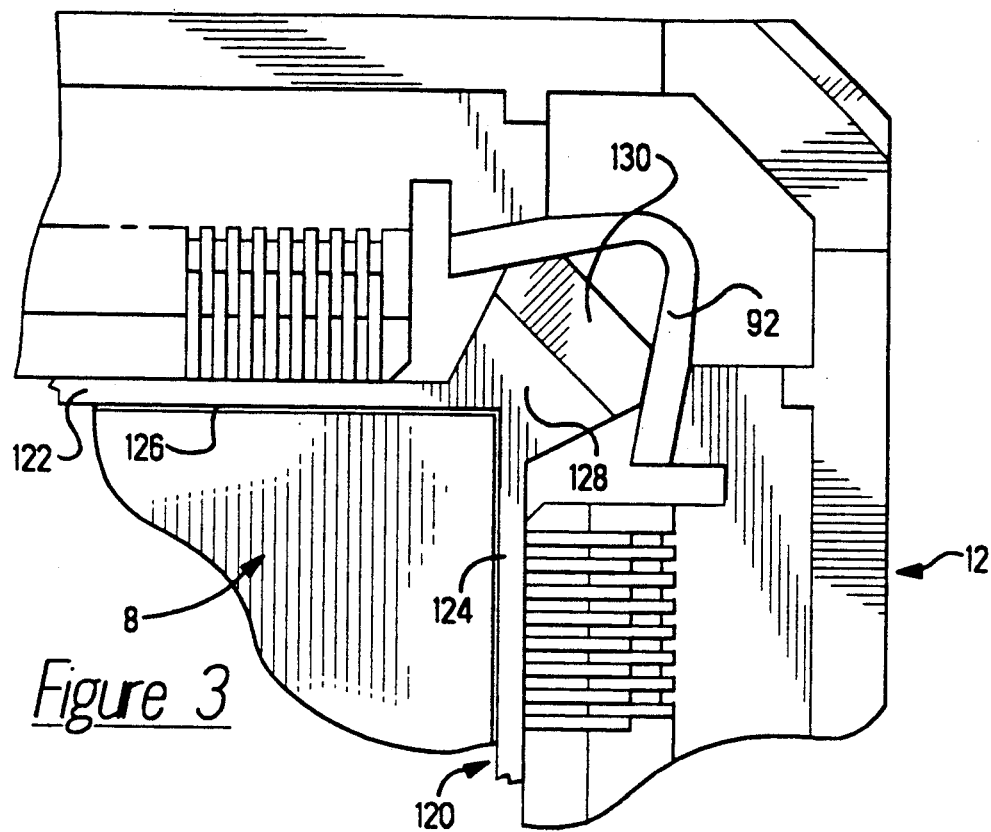
Figure 3
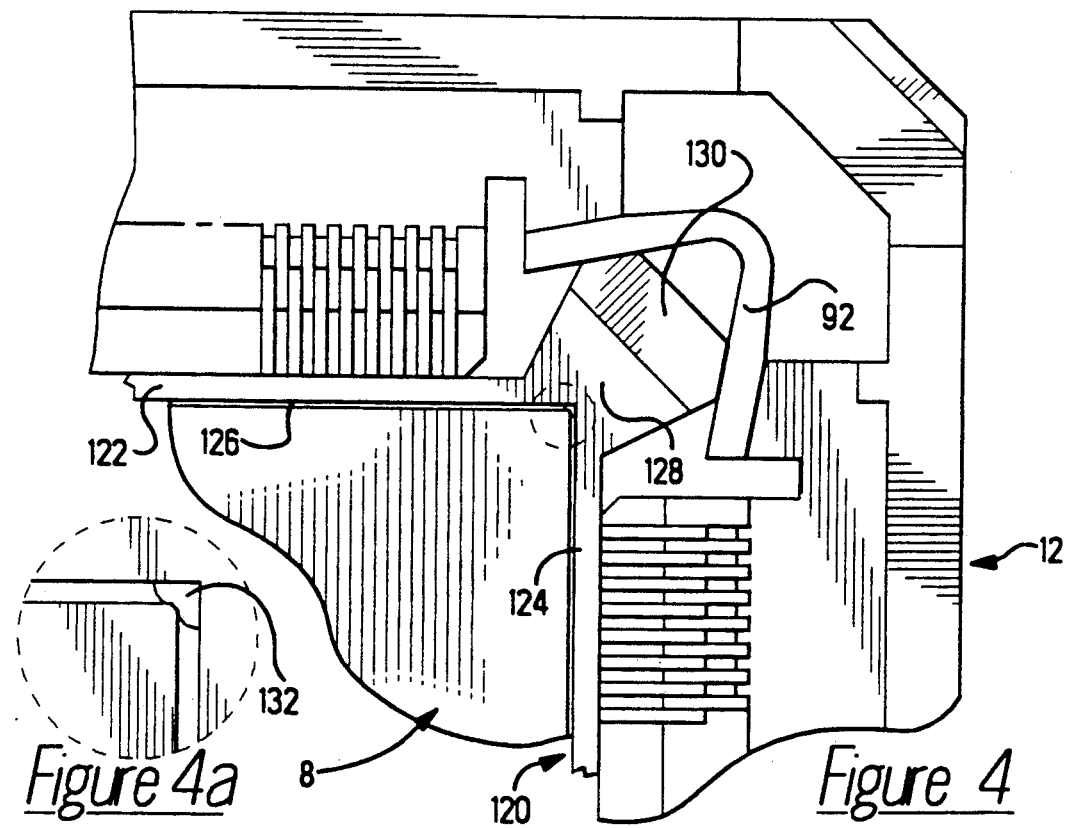
Figure 4a
Figure 4

5,022,869

ADAPTER FOR USE WITH A BUMPERLESS CHIP CARRIER

FIELD OF THE INVENTION

The invention is directed to an adapter which facilitates the handling of a bumperless chip carrier. In particular, the invention relates to an adapter which allows the bumperless chip carrier to be used in the same chip carrier socket as other chip carriers.

BACKGROUND OF THE INVENTION

Integrated circuits are commonly mounted in chip carriers which are bodies of insulating material having side surfaces to which conductors from the integrated circuit extend. Traditionally, terminal pads are provided on the side surfaces of the chip carrier body and contact is made with these pads to connect the integrated circuit or a circuit board. Electrical connection is usually established with the terminal pads on the chip carrier by means of a chip carrier socket which comprises a socket body having a recess which receives the chip carrier and contact terminals in surrounding relationship to the recess so that when the chip carrier is placed in the recess, the contact terminals electrically engage the terminal pads of the chip carrier.

Notwithstanding the relatively small size of the chip carrier socket and the contact terminals in the socket, it is necessary that each terminal be capable of exerting a significant contact force on a terminal pad in a chip carrier in order to establish good electrical connection between the contact terminal and the terminal pad on the chip carrier, particularly if the terminal pad is tin plated rather than gold plated. It should also be noted that chip carrier sockets are subject to the dimensional variations which all mass produced parts are subjected to. These dimensional variations result from manufacturing tolerances. However, even with dimensional variations, the design and performance requirements discussed above must be satisfied even in "worst case" conditions. For example, the minimum required contact force for each contact must be met even if the particular terminal pad that a contact terminal engages is at the lower end of the tolerance and the contact terminal similarly is at the lower end of the tolerance range for the parts.

For the new emerging family of modified gull wing chip carriers, a new socket was required, as the prior art connectors were insufficient for this type of lead configuration. This type of new socket is shown in copending U.S. application Ser. No. 191,635, filed on May 6, 1988 now U.S. Pat. No. 4,872,845. It is worth hoting that this new socket provides a contact force which is sufficient to insure that a proper electrical connection is effected and maintained.

The cover and socket illustrated in the above-referenced application is configured to receive a chip carrier therein. The chip carrier must have projections extending from the corners thereof in order insure that the chip carrier is properly positioned in the chip carrier socket. The requirement of projections provided on the corners of the chip carrier is not always advantageous. In certain situations, bumperless ceramic quad flat pack must be used. Consequently, as the bumperless flat pack chip carrier must also be tested, it would prove beneficial to have an adapter which allowed the bumperless chip carrier socket to be inserted into the chip carrier socket referred to above, thereby allowing the leads of the bumperless chip carrier to make a positive electrical engagement with the terminals of the chip carrier socket.

SUMMARY OF THE INVENTION

The invention is directed to an adapter for use with a chip carrier. The adapter cooperates with the chip carrier to insure that the chip carrier will be inserted and maintained in a chip carrier socket assembly.

The adapter has frame means which have an opening provided in the center thereof. The opening is dimensioned to receive the chip carrier therein. Securing means extend from the frame means, the securing means are configured to cooperate with resilient retention means of the chip carrier socket assembly, thereby maintaining the adapter in the chip carrier socket assembly.

The cooperation of the securing means with the retention means of the chip carrier socket assembly insures that the chip carrier will be precisely positioned and maintained in the chip carrier socket assembly.

The adapter may be provided with engagement means. The engagement means are provided on the frame means and cooperate with the chip carrier socket to maintain the chip carrier socket in the opening of the frame means.

BRIEF DESCRIPTION OF THE DRAWINGS

FIG. 3 is a partial top view showing a respective securing arm of the cover in engagement with a corner of the adapter.

FIG. 4 is a partial bottom view, similar to that of FIG. 3, showing an alternative embodiment, in which the adapter is positioned in frictional engagement with the chip carrier.

FIG. 4a is an enlarged view of the portion of FIG. 4 indicated by the dotted line.

DETAILED DESCRIPTION OF THE INVENTION

Figure 1:
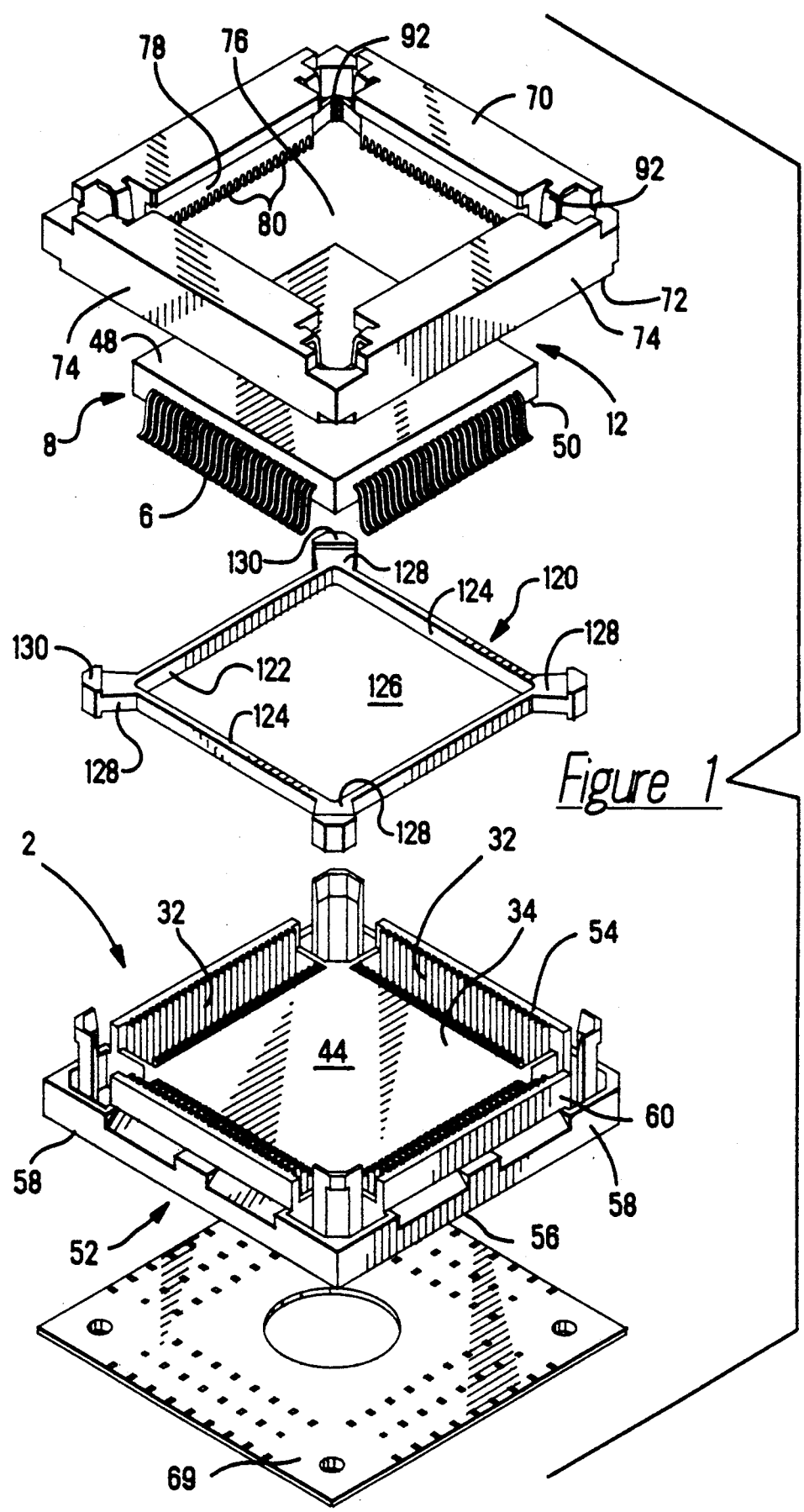
FIGURE 1 is a perspective view of a chip carrier socket with a bumperless chip carrier and adapter according to the present invention exploded therefrom.
Figure 2:
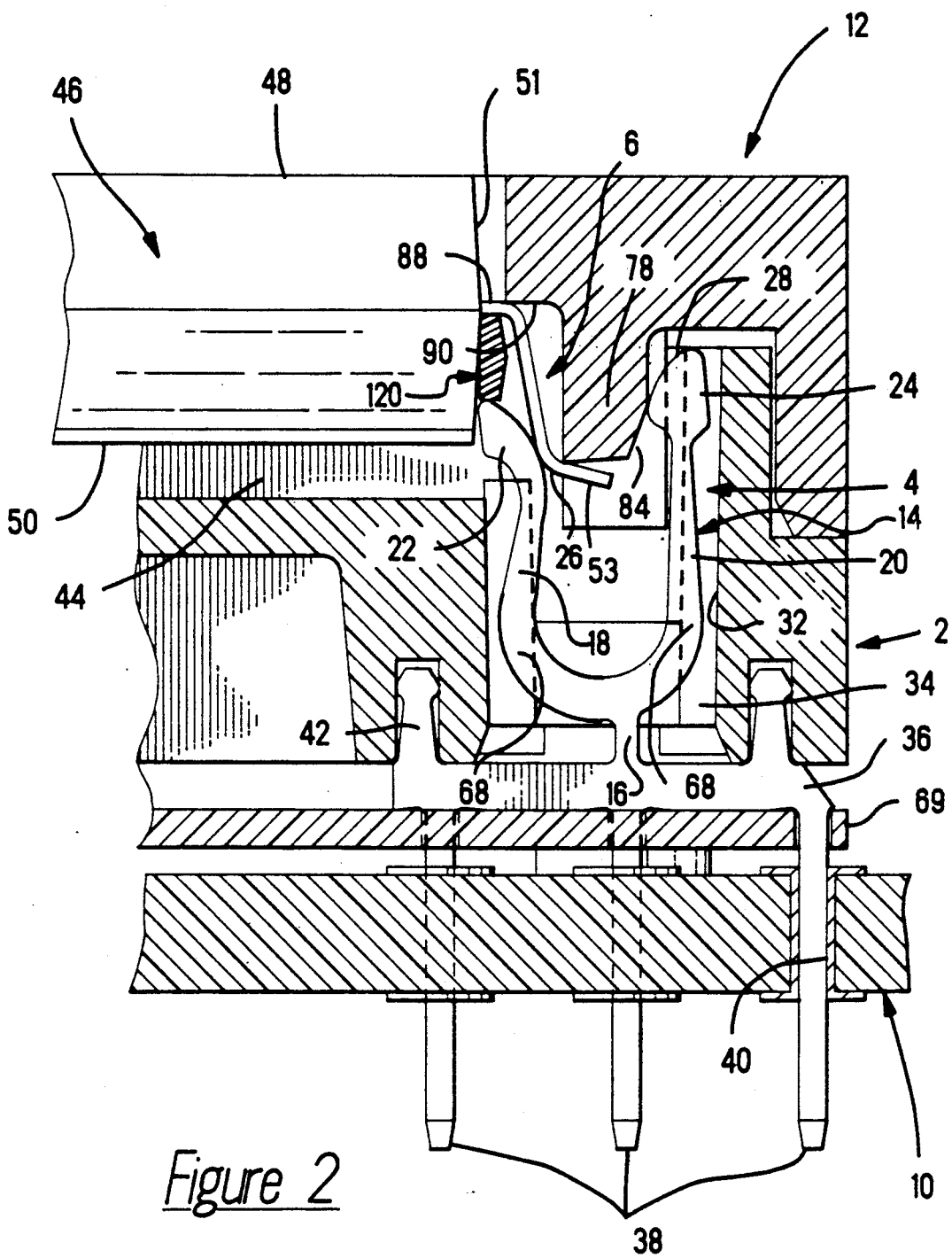
FIG. 2 is a partial cross-sectional view of the chip carrier socket after the chip carrier, adapter, and cover have been inserted therein.

FIG. 1 shows a chip carrier socket 2 containing terminals 4 (FIG. 2) which engage contact leads 6 of a chip carrier 8. Referring to FIG. 2, each terminal 4 is a complanate or flat member of the type commonly produced by etching or by stamping sheet metal so that it has oppositely facing major surfaces and edges extending between the major surfaces The thickness of the terminals may vary depending upon the requirements in a particular situation.

As is best shown in FIG. 2, each terminal 4 comprises a resilient portion 14 having a flexible leg 16 extending from the resilient portion !4. The resilient portion 14 has a rounded, U-shaped configuration which is comprised of two resilient arms 18, 20. The first resilient arm 18 and the second resilient arm 20 have free ends 22, 24 which are spaced from each other but which are flexed relatively away from each other when the terminal 4 is stressed. The resilient arm 20 is slightly longer than resilient arm 18.

The first resilient arm 18, of each terminal 4, is a contact arm and has a rightwardly facing, as viewed in FIG. 2, contact surface 26 which cooperates with a respective lead 6 of the chip carrier 8. The second resilient arm 20 has a leftwardly facing lead-in surface 28 which helps to guide the cover 12 into place. Positioned below the lead-in surface 28 is a securing surface or shoulder 30 which cooperates with the cover 12 to maintain the cover 12 in position. It should be noted that neither of the free ends 22, 24 nor any portion of the resilient arms 18, 20 is in engagement with side surfaces 32 of a terminal receiving cavity 34 of socket 2 when the terminal 4 is in an unstressed or first position.

The U-shaped resilient portion 14 is pivotally mounted on leg 16. This allows the U-shaped resilient portion 14 to adjust for any dimensional variation or misalignment of the chip carrier 8 when the chip carrier is inserted into the socket 2. Dimensional variation or misalignment of the chip carrier 8 can cause the component lead positions to vary. Therefore, it is important that the U-shaped resilient portion 14 of each terminal 4 be free to pivot in order to compensate for this varied lead position. Consequently, as the terminals 4 of the socket 2 can adjust to the varied position of the leads 6 of the chip carrier 8, a positive electrical connection will be effected and maintained between each lead 6 and the respective terminal 4.

The leg 16 of each terminal 4 is integrally attached to a horizontal bar 36 from which a number of mounting portions 38 extend downward. As is indicated in FIG. 2, all but one of these mounting portions 38 are removed from any given terminal 4, thereby providing the required footprint to match the holes 40 in the substrate 10.

Each horizontal bar 36 has two support portions 42 which extend upward, in the same direction as leg 16. These support portions 42 are provided to cooperate with the housing of the socket 2 to provide support for the side walls 32 of the terminal receiving cavity 34.

When the terminals 4 are contained in the chip carrier socket 2 and the chip carrier 8 is placed in a chip carrier receiving recess 44 of the chip carrier socket 2, leads 6 and a portion of cover 12 extend between free ends 22, 24 of resilient arms 18, 20, as shown in FIG. 2. The effect is to impose a force on the free ends 22, 24 of the resilient arms 18, 20 of the terminals 4. As a result of the imposition of this force, the resilient arms 18, 20 function as a spring system and the arms 18, 20 are flexed relatively away from each other. The stresses induced in the terminal 4 as a result of the force are largely concentrated in the arms 18, 20, and only a very minor portion of the force is transmitted through the leg 16 to the horizontal bar 36 and to the mounting portions 38.

Turning now to FIG. 1, the previously identified chip carrier 8 comprises, in the disclosed embodiment, a generally square chip carrier body 46 having upper and lower major surfaces 48, 50 and side surfaces 51. Side surfaces 51 extend between first major surface 48 and second major surface 50. Side surfaces 51 are slightly bowed, as is best shown in FIG. 2. First ends of the leads 6 extend into the body 46 and are connected to the integrated circuit chip (not shown) therein. Second ends of the leads 6 extend from side surfaces 51 of body 46 in a generally downward fashion, (modified gull wing configuration) as is shown in FIGS. 1 and 2. The end portions 53 of leads 6 are bent such that the bottom surface of end portions 53 are approaching parallel to the lower major surface 50.

An adapter 120, as best shown in FIG. 2, is provided to cooperate with the chip carrier 8, in order to insure that the chip carrier will be properly positioned in the chip carrier socket and the cover therefor. Referring to FIG. 1, the adapter 120 is a molded frame which has an essentially square configuration. The adapter has a pair of oppositely facing first side walls 122 and a pair of oppositely facing second side walls 124, which are essentially perpendicular to the first side walls. A chip carrier receiving opening 126 is positioned between walls 122, 124. The opening 126 is dimensioned to allow a respective chip carrier 8 to be inserted therein. However, the dimensions of walls 122, 124 must be only slightly greater than the outside dimensions of the housing of the chip carrier, so that the adapter 120 can be positioned between the housing of the chip carrier 8 and the free ends of the leads 6 of the chip carrier 8, as shown in FIG. 2.

Provided at each corner of the adapter 120 are projections 128. The projections 128 have a larger height than the walls 122, 124, and have free ends 130 which are configured to cooperate with the cover 12. As will be noted from FIG. 1, the projections are symmetrical about the plane which extends through the central axis of each side wall 122, 124. This configuration insures that the adapter 120 cannot be improperly inserted on the chip carrier 8. It is also worth noting that the height of the projections is dimensioned to insure for the proper insertion of the adapter into the cover 12, as will be more fully discussed.

Referring to FIG. 1, the chip carrier socket 2 comprises a socket body 52 having first and second major surfaces 54, 56 and side surfaces 58. The side surfaces 58 have an offset portion 60 proximate the first major surface 54, the offset portion 60 being provided to cooperate with the cover 12, as will be discussed. Chip carrier receiving recess 44 extends from the first major surface 54 toward the second major surface 56 and has recess side surfaces which correspond to respective side walls 32 of terminal receiving cavities 34 which extend to the second major surface 56 of socket 2.

Terminal-receiving cavities 34 are provided in the recess 44 and extend from the first major surface 54 to the second major surface 56. Each cavity 34 extends from proximate a corner of the recess 44 to proximate an adjacent corner of the recess 44. Cavities 34 have a general rectangular shape. Side-by-side slots 68 are provided side walls 32. These slots 68 cooperate with the respective terminals 4 to align the terminals 4 in the proper position. As is shown in FIG. 2, the terminals 4 are positioned in the slots 68, thereby preventing the terminals 4 from engaging each other, which in turn prevents the terminals 4 from shorting. It should be noted, that in order for chip carrier 8 to be inserted into chip carrier receiving recess 44, respective inner side walls 32 can not extend all the way to the first major surface 54.

Respective terminals 4 are positioned in each slot 68 as shown in FIG. 2. The terminals 4 do not contact side walls 32 when the terminals 4 are in an unstressed position. However, the spacing between side walls 32 is dimensioned such that the side walls 32 act as overstress means as the terminals 4 are stressed, i.e. sidewalls 32 prevent terminals 4 from bending far enough to take a permanent set. Consequently, side walls 32 of terminal receiving cavities 34 prevent the terminals 4 from taking a permanent set which would result in an ineffective electrical connection. In order to provide the side walls 32 with enough support to prevent the overstress of the terminals 4, the support members 42 which extend from the horizontal bars 36 of the terminals 4 are positioned in the housing 52 of the chip carrier socket 2. The positioning of terminals 4 allows the strength of the metal terminals 4 to reinforce the strength of the plastic housing 52, thereby providing the side walls 32 with the support necessary to prevent the overstress of the terminals 4.

Mounting portions 38 of terminals 4 extend from the second major surface 56 of chip carrier socket 2. A protective strip 69 is provided proximate the ends of mounting portions 38, the strip 69 cooperates with mounting portions 38 to maintain mounting portions 38 in proper position and to prevent the bending of mounting portions 38. As chip carrier socket 2 is inserted on the circuit board 10, protective strip 69 is moved along mounting portions 38 until protective strip 69 is proximate second major surface 56, thereby allowing mounting portions 38 to be inserted into circuit board 10.

Referring to FIG. 2, cover 12 cooperates with the chip carrier 8, to prevent damage to the leads 6 of the chip carrier 8. Cover 12 is comprised of a first major surface 70, a second major surface 72, and side surfaces 74 extending therebetween. A chip carrier receiving recess 76 is provided in cover 12. The chip carrier receiving recess 76 extends from the first major surface 70 to the second major surface 72.

Extending in the recess 76 are chip carrier protective arms 78 which cooperate with the leads 6 of the chip carrier 8, as shown in FIG. 2. Each lead 6 of chip carrier 8 is positioned in a slot 80 of arm 78. These slots 80 are provided to prevent leads 6 from electrically engaging one another, and also to provide protection to the leads 6, preventing the leads 6 from being damaged as the chip carrier 8 is inserted into the chip carrier socket 2.

Chip carrier 8 and adapter 120 are inserted into the cover 12 through the second major surface 72 thereof. However, before the chip carrier 8 and adapter 120 are inserted, the adapter is positioned on the chip carrier. The lower major surface 50 of the chip carrier 8 is inserted into the opening 126 of the adapter. This insertion continues until a fixed end of the leads 6 of the chip carrier engage the leading surfaces of the walls 122, 124 of the adapter 120. In this position, the chip carrier is maintained in alignment with the adapter. This alignment in maintained due to the cooperation of the end leads with the projections 128. It should be noted that although this alignment is not precise, it is sufficient to provided the chip carrier 8 in approximately the desired position. With the chip carrier 8 positioned on the adapter, the adapter and chip carrier are inserted into the cover 12. Insertion continues until leading surfaces 88 of the leads 6 engage surfaces 90 of slots 80. This engagement prevents the chip carrier 8 from being further inserted in cover 12. In this position the bottoms surfaces of the projections 128 are provided proximate the same plane as the second major surface 72 of the cover 12. It should be noted that the final precise alignment of the leads 6 occurs as the chip carrier and adapter are inserted into the cover. As this insertion occurs, the leads of the chip carrier cooperate with the protective arms 78 of the cover 12 to insure that the leads will be moved into the respective recesses. This insures that the leads are properly positioned.

When the chip carrier and adapter are fully inserted into the cover 12, the chip carrier 8 is maintained in the cover 12 by the cooperation of the adapter 120 with the cover 12. As is shown in FIG. 3, resilient securing arms 92 engage respective surfaces of the free ends 130 of the projections 128 of the adapter. These respective surfaces are angled, as shown in FIG. 3. Consequently, as the adapter 120 is inserted into the cover 12, the resilient securing arms 92 will provide enough frictional engagement with the projections 128 to prevent the adapter 120 from falling out of the recess 76 of the cover 12. As the chip carrier 8 is sandwiched between the adapter and cover, the chip carrier 8 is maintained in the cover 12.

FIG. 4 illustrates an alternative embodiment of the adapter 120. In this embodiment an embossment 132 is provided in each corner of the adapter. The embossment extends into the opening 126, such that as the adapter is positioned over the chip carrier 8, the embossments cooperate with the chip carrier to provide a frictional engagement therebetween. This insures that the chip carrier will be retained in the adapter, even if the chip carrier and the adapter are not inserted into the cover.

In operation, the chip carrier 8 is inserted into the cover 12 and maintained therein, as was described. The chip carrier and cover subassembly is then inserted into the chip carrier socket 2. It should be noted that as this insertion occurs, leads 6 of chip carrier 8 are force to conform to the shape of the slots 80 of the cover 12, as shown in FIG. 2. This insures that leads 6 will be in engagement with cover 12, thereby insuring the the force applied to the leads 6 by the resilient arms 18 will be absorbed by the cover 12. Consequently, the fragile leads 6 of the chip carrier 8 are not damaged as insertion occurs, due to only minimal forces being directed at the leads.

As insertion occurs, leads 6 and protective arms 78 are inserted between the resilient arms 18, 20 of the terminals 4. However, as the Width of the leads 6 and protective arms 78 is greater than the distance between the free ends 22, 24 of the resilient arms 18, 20, the resilient arms 18, 20 are forced apart. This force insures that as the insertion continues, the leads 6 will frictionally engage the contact surfaces 26 of the resilient arms 18. In other words, a contact wipe action will occur as insertion takes place. Consequently, a force exists at all times between the leads 6 and the contact surfaces 26 of terminals 4, thereby insuring that a positive electrical connection is maintained.

It is worth noting that the operation of the chip carrier socket and cover described is essentially identical to the operation of the chip carrier socket and cover described in copending U.S. application Ser. No. 191,635, filed May 6, 1988. However, as described in that application, the cover and socket cooperate with a chip carrier which has integral molded projections which extend from the chip carrier housing. Consequently, the adapter of. the present invention allows various chip carriers to be inserted into the same chip carrier socket and cover as is used for chip carriers with projections. This is an extremely beneficial result, as the use of the adapter eliminates the need to manufacture different chip carrier sockets and different covers for different chip carriers. Therefore, the use of the adapter greatly reduces the cost of testing, as large quantities of one socket are cheaper to manufacture than small quantities of a number of sockets.

Changes in construction will occur to those skilled in the art, and various apparently different modifications and embodiments may be made without departing from the scope of the invention. The matter set forth in the foregoing description and accompanying drawings is offered by way of illustration only.

What is claimed is:

1. An adapted for use with a chip carrier which has an essentially rectangular configuration, the chip carrier has leads which extend from side edges thereof, the adapter comprising:

a frame having an essentially rectangular configuration with a first surface and an oppositely facing second surface, the frame having a chip carrier opening which extends from the first surface to the second surface, the chip carrier opening being dimensioned to receive the chip carrier therein, the first surface of the frame cooperates with the leads of the chip carrier when the chip carrier is inserted into the chip carrier opening to act as a stop surface, insuring that the chip carrier will be properly positioned in the chip carrier opening;

projections provided in corners of the frame, the projections extend outwardly from the frame in a direction away from the chip carrier opening;

retention means which cooperate with the chip carrier to retain the chip carrier in the chip carrier opening;

whereby the adapter provides the chip carrier with the projections required to provide for the manipulation of the chip carrier.

2. An adapter as recited in claim 1 wherein the frame has a pair of oppositely facing first side walls and a pair of oppositely facing second side walls which are essentially perpendicular to the first side walls.

3. An adapter as recited in claim 2 wherein the projections are provided in each corner of the frame, the projections are symmetrical about a plane which extends through the central axis of each sidewall.

4. An adapter as recited in claim 3 wherein the projections have a larger height than the side walls of the frame, such that as free ends of the projections cooperate with the chip carrier retention device, the chip carrier will be adequately maintained in position.

5. An adapter as recited in claim 1 wherein the retention means are embossments which extend into the chip carrier opening, such that as the chip carrier is positioned in the cip carrier opening, the embossments will engage side surfaces of the chip carrier to provide a frictional engagement therebetween.

* * * * *